July 11, 1967 L. R. ULLERY, JR., ETAL 3,330,696

METHOD OF FABRICATING THIN FILM CAPACITORS

Filed April 27, 1964

INVENTORS
LEE R. ULLERY, JR.
DOMENICK J. GARIBOTTI
BY Roger A. Van Kirk
ATTORNEY United States Patent Office 3,330,696

Patented July 11, 1967

3,330,696

METHOD OF FABRICATING THIN FILM CAPACITORS

Lee R. Ullery, Jr., Simsbury, Conn., and Domenick J. Garibotti, Longmeadow, Mass., assignors to United Aircraft Corporation, East Hartford, Conn., a corporation of Delaware Filed Apr. 27, 1964, Ser. No. 362,853
8 Claims. (Cl. 117—212)

This invention relates to thin film electrical circuit components. More particularly, this invention is directed to an improved method for fabricating thin film capacitors and the device produced by this novel method.

In the usual case, a thin film capacitor comprises a substrate and layers of material bonded thereto. For example, a common form of thin film capacitor comprises a ceramic wafer upon which two conductive films separated by a dielectric layer have been deposited. Present techniques for the fabrication of thin film capacitors normally comprise the formation of the multilayer structure on the substrate by techniques such as vacuum deposition or sputtering through a mask. Once the conductive layers, which form the capacitor plates, and the dielectric layer have been deposited, a plurality of devices may be isolated from each other by various state-of-the-art techniques. Deposition of the layers which comprise the capacitor through a mask has been found to be an unsatisfactory approach since each capacitor configuration requires the design and manufacturing of a specific mask. Also, and more importantly, in the prior art the only control available insofar as the ultimate value of capacitors is concerned was the thickness of the dielectric material. That is, once a mask and the dielectric material had been selected, the size of the capacitor plates is fixed and the only means to control the capacitance resided in controlling the distance between the plates by regulating the length of time during which the dielectric material was deposited over the first deposited conductive layer. Since this control is difficult and further since changes in dielectric constant often occur after deposition, it has been found that thin film capacitors fabricated by the prior art techniques have a 20% tolerance about the specified value. Other prior art techniques, such as anodizing the first formed plate to produce a dielectric material, are limited because they require that the substrates must be exposed to an aqueous solution. Quite often such exposure degrades other components previously deposited on the wafers. This invention overcomes the above-mentioned deficiencies of the prior art and permits fabrication of thin film capacitors having extremely low tolerance.

To accomplish the foregoing, the conductive plates and the separating dielectric material are deposited on a substrate by prior art methods such as vacuum deposition, sputtering and pyrolytic deposition. After stabilization and cooling to room temperature, the multilayer structure is electron beam scribed to isolate it into a plurality of capacitors. In the prior art, such isolation had been achieved by photoetching or mechanical processes such as micro sandblasting techniques. However, these prior art techniques are inferior to an electron beam subtractive process since they degrade the exposed surfaces of the device and result in relatively wide cuts thus considerably reducing useful area and efficiency. Also, when the mechanical etching processes such as sandblasting or diamond scribing are utilized, the insulation base or substrate is torn and the conductive material is frequently not completely removed leaving small conductive bridges across the desired gap. Thus, reproducibility of manufacture is not attainable. Further, as should be obvious, mechanical or photochemical processes are extremely slow as compared to an electron beam scribing procedure. Further advantages of electron beam scribing reside in the ability to automate, by programming the deflection of the electron beam, and the ability to constantly monitor the value of the device during the process.

While resulting in substantial improvement, electron beam isolating of thin film devices can not by itself result in the production of thin film capacitors having very small tolerances. That is, the isolation of a plurality of capacitors by electron beam scribing results in a process which may be automated and which will be rapid and reproducible. However, the tolerance of these independent capacitors is still controllable only by varying the thickness of the dielectric material which separated the capacitor plates.

This invention overcomes all of the above-described limitations and disadvantages of the prior art and provides a method of producing thin film capacitors having extremely low tolerances.

It is therefore an object of this invention to fabricate a thin film capacitor.

It is a further object of this invention to fabricate thin film capacitors having lower tolerances than previously available.

It is also an object of this invention to fabricate thin film capacitors by a process which is capable of automation and susceptible of reproducibility.

It is yet another object of this invention to fabricate thin film capacitors having low tolerances rapidly and inexpensively.

These and other objects of this invention are accomplished by depositing a multilayer structure consisting of two conductive layers, which comprise the capacitor plates, and a separating layer of dielectric material on a substrate. The multilayer structure is then electron beam scribed to isolate several discrete capacitors. In this scribing step, both conductive layers and the insulating layer are removed to the substrate surface thus achieving complete isolation. The upper conductive layer, which forms the upper conductive plate of each of the capacitors, is then trimmed by an electron beam scribing or subtractive process until the desired capacitance results. As each of the discrete capacitors is trimmed to value, the leakage path between the upper and lower electrodes is simultaneously increased by the preferential removal of metal from the edges of the upper plate.

This invention may be better understood and its various advantages will be obvious to those skilled in the art by reference to the accompanying drawing wherein like reference numerals refer to like elements in the various figures and in which.

Figure 1:
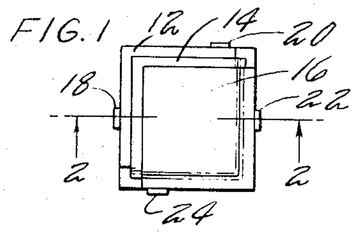
FIGURES 1 through 6 illustrate various stages or steps in the fabrication of a thin film capacitor in accordance with this invention.

To fabricate a capacitor in accordance with this invention, the conductive and dieleceric films must first be deposited on a substrate. As a general rule, the three layers are deposited as area films through three masks to produce the overlapping structure best shown by FIGURES 1 and 2. In these figures, the substrate is indicated at 10, the lower conductive film or capacitor plate at 12, the dielectric material at 14 and the upper conductive film or capacitor plate at 16. As shown in the drawing, contact may be made to the lower conductive layer by contact pads 18 and 20 and to the upper conductive layer by contact pads 22 and 24. These contact pads are deposited on the substrate prior to the build-up of the multilayer structure.

To be suitable, the substrate material must conform to the requirements imposed by the various process steps. It is preferred that the substrate be possessed of a smooth surface whch s completely free from sharp changes n contour. The substrate should also be able to withstand temperatures as high as 300 to 400° C. since it may be heated to temperatures in this range during the deposition steps. Also, the substrate material should have a high resistivity. Preferred substrate materials for this invention consist of glasses and ceramics. After cleaning according to practices well known in the art, the substrate will be suitably positioned behind a mask and a vacuum deposition apparatus. The techniques for applying the films to the substrate are well known in the art and are not considered a part of this invention. For a complete explanation of such vacuum deposition techniques, reference may be had to Vacuum Deposition of Thin Films, by L. Holland, published by John Wiley and Sons, Inc., New York, 1956. In one example, conductive films 12 and 16 may be vacuum deposited aluminum 3000 A. thick while dielectric layer 14 will be vacuum deposited SiOx 10,000 A. thick. The three deposition steps, as mentioned above, utilize three masks so as to produce the multilayer structure shown in FIGURES 1 and 2. In this structure, lower conductive layer or plate 12 is in electrical contact with pads 18 and 20 and is insulated from upper conductive layers 16 by dielectric layer 14. Upper conductive layer 16 wraps around dielectric layer 14 and makes electrical contact with pads 22 and 24.

Figure 2:
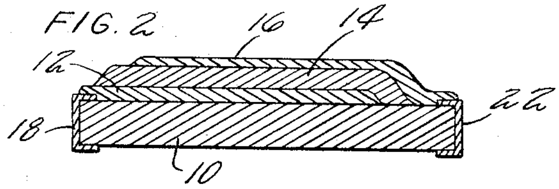
Figure 7:
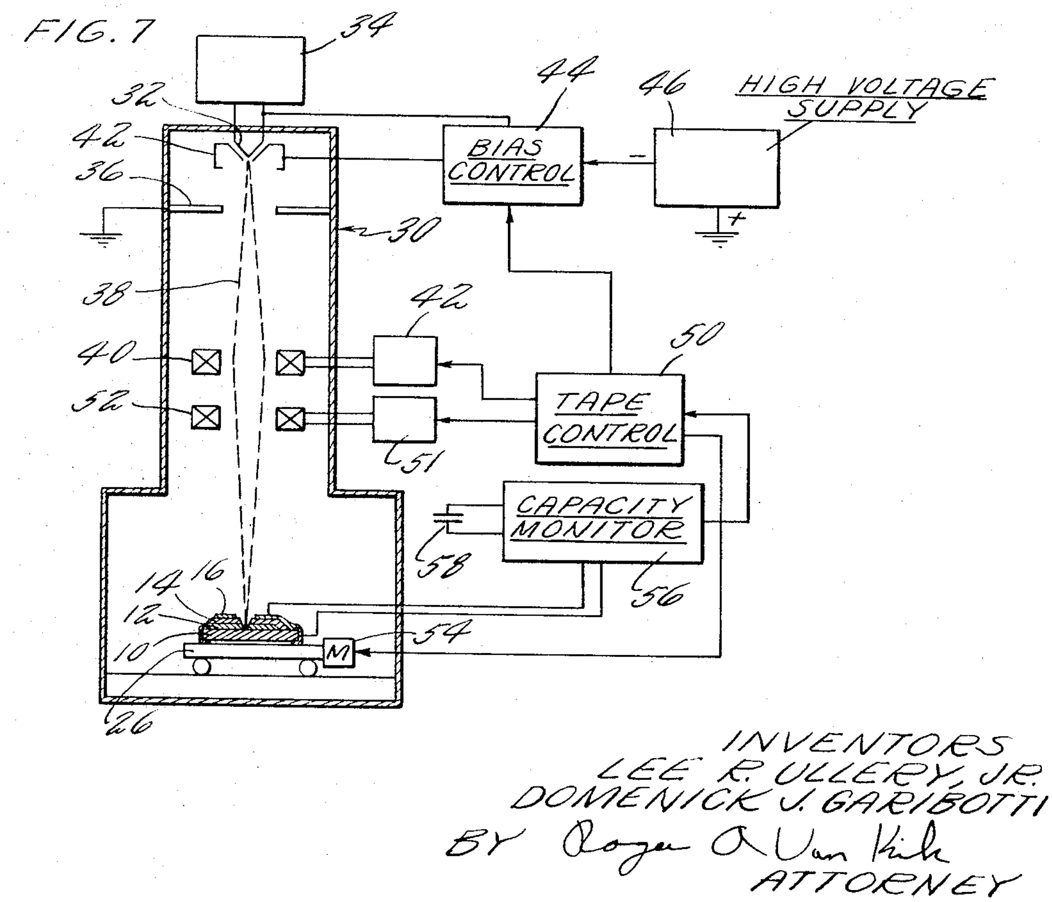
FIGURE 7 illustrates apparatus used in performance of the steps illustrated by FIGURES 1 through 6.

After stabilization by annealing, at 200° C. in the case of the above composite, and cooling to room temperature, the multilayer structure shown in FIGURES 1 and 2 is positioned on a movable work table in the evacuated work chamber of an electron beam machine. Such a machine is shown in FIGURE 7. In this figure, the substrate 10 with the three layers deposited thereon is depicted as being located on a movable work table 26 in the vacuum chamber of an aparatus which generates an intense beam of electrons. As noted above, and as will be explained more fully below, there are a number of advantages inherent in the use of an electron beam as a tool for working materials. In order to obtain these advantages, the electron beam generator utilized must be a precision instrument capable of providing a highly focused electron beam. U.S. Patent No. 2,987,610, issued June 6, 1961, to K. H. Steigerwald, discloses such as electron beam machine. Apparatus such as that shown in the Steigerwald patent, as a result of recently developed refinements in electron optics, can provide a beam focused to produce power densities on the order of 10 billion watts per square inch. Such beams may be collimated so as to have diameters in the micron range at the point of impingement on the work. As is now well known, electron beam machines are devices which use the kinetic energy of an electron beam to work a material. An electron beam is a tool which has practically no mass but has high kinetic energy because of the extremely high velocity imparted to the electrons. Transfer of this kinetic energy to the lattice electrons of the workpiece generates higher lattice vibrations which cause an increase in temperature within the impingement area sufficient to accomplish work. In an electron beam scribing process, the increase in temperature is of sufficient magnitude to cause vaporization of the material impinged upon.

As mentioned above, there are a number of inherent advantages in using the electron beam as a tool to work materials. The most important of these advantages resides in the fact that the electron beam as a tool can be easily controlled since it may be readily focused, its power simply adjusted and it may be precisely deflected electrically to any desired point. Also, a beam of electrons is extremely pure in the chemical sense in that it contains no contaminates and, since working with an electron beam is usually performed in a vacuum, the possibility of unwanted contamination of the work is virtually eliminated. Referring now again to FIGURE 7, an electron beam machine is shown generally as 30. In machine 30 electrons are emitted by a directly heated cathode 32 which is connected to a source of heating current 34.

The electrons emitted by cathode 32 are caused to be accelerated toward the workpiece by a negative D.C. acceleration voltage which is applied between cathode 32 and a grounded, apertured anode 36. The accelerated electrons are focused into a beam 38 by means clearly shown and described in the above-mentioned Steigerwald patent. The electron beam 38 is focused to provide the desired beam diameter or spot size at the workpiece by varying the current supplied to magnetic lens assembly 40 from a lens current supply 42. Initially, beam 38 will be gated off by a blocking voltage applied between the cathode 32 and a control electrode 42 by a bias voltage control 44. Bias voltage control 44, which is connected between the negative terminal of acceleration voltage supply 46 and the cathode and control electrode, may be of the type disclosed in copending application Ser. No. 214,313, filed Aug. 2, 1962, and now Patent No. 3,177,434, by J. A. Hansen, and assigned to the same assignee as this invention. Beam 38 will be gated on in response to commands generated by a tape control 50 and supplied to bias control 44. Beam 38 may be caused to trace a desired pattern on the workpiece, which in this case is a multilayer structure formed on substrate 10, by varying the current supplied by deflection voltage supply 51 to a set of magnetic deflection coils 52, only two of which are shown, or by causing motor 54 to drive movable table 26 in the desired direction. Both the beam deflection and the movement of table 26 may be programmed by information read into tape control 50. Tape control 50, which may alternatively be any well known means for storing several channels of digital information and for reading out this information in analog form, may also be utilized to control the beam intensity and thus its penetration by controlling the magnitude of the pulses supplied to control electrode 42 by bias control 44. Similarly, control 50 may be utilized to control the focus of the beam by regulating lens current supply 42.

Figure 3:
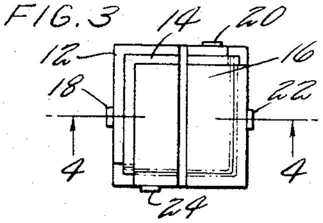
Figure 4:
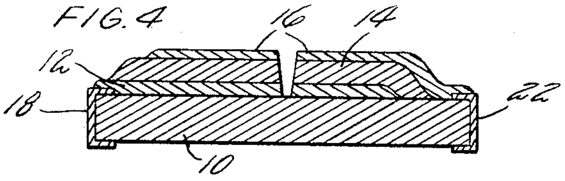

As mentioned above, the first step in the practice of this invention comprises the deposition or otherwise forming of the multilayer structure depicted in FIGURES 1 and 2. This multilayer structure is positioned on the movable work table 26 of electron beam machine 30 and the table is positioned generally in line with the axis of beam 38. The work chamber of the electron beam machine is then evacuated and the beam generator activated. As mentioned above, one of the first steps in the fabrication of the multilayer structure comprised the formation of contact pads 18, 20, 22, and 24 on the edges of substrate 10. Since, in the example situation to be described, four contact pads are established on the substrate, the multilayer structure lends itself to the fabrication of two thin film capacitors. However, it is to be understood, that more than two such devices may be isolated on one surface of the substrate and that the other side of the substrate may also be utilized for the fabrication of thin film capacitors or other passive devices or for the mounting of active devices and thin film circuitry. After proper positioning of the multilayer structure in the electron beam machine, tape control 50 will take command and control the operation. However alternatively, the steps to be recited below may be controlled manually by an operator of the electron beam machine. The first step to be performed with the electron beam machine is the scribing of the multilayer structure to isolate two capacitors. In order to accomplish the foregoing, the beam intensity and the rate of relative movement between the beam and the work are selected such that the beam will penetrate through all three layers but will cause in the most extreme situation, only very slight fusing of the surface of the substrate. In the case where beam deflection is utilized to produce the relative motion, the beam will preferably be deflected across the workpiece and will operate in a pulsed mode. That is, the beam will be deflected completely across the workpiece while being pulsed on and off thereby generating a series of overlapping beam impingement points. Utilizing a pulsed mode of operation minimizes the heat effected zone by giving material adjacent the beam impingement point an opportunity to cool down between the pulses. However, due to the extremely high kinetic energy of the electrons which comprise beam 38, the material in the path of the beam will be vaporized and a cut or groove, as is shown in FIGURES 3 and 4, wherein all material has been removed will result.

Figure 5:
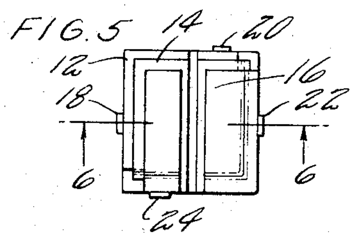
Figure 6:
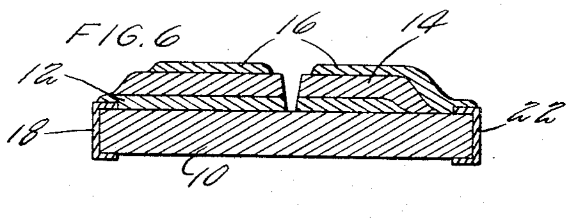

At this point, after isolation of the capacitors, prior art methods of the fabrication of thin film capacitors were completed. That is, after the step of isolation by some method such as diamond scribing or chemical milling, the values of the capactors were measured and, if within 20% of the desired value, they were treated as useable devices. In accordance with this invention, further steps are performed to bring the thin film capacitors within 1% of the desired value. These further steps comprise reducing the beam intensity and/or increasing the speed of relative movement between the beam and the work such that the beam will only penetrate to the depth of upper conductive layer 16. This penetration control may be done automatically under the command of tape control 50. The readjusted beam is directed to impinge on upper conductive layer 16 along the edge of the isolation region or groove produced by the preceding electron beam scribing step. The beam is then caused to be deflected and pulsed in the manner described above whereby upper conductive layer 16 is cut back. By this subtractive process, the size of the upper plate of the capacitor is reduced thereby adjusting the capacitance toward the desired value. Prior to positioning the multilayer structure in the work chamber of the electron beam machine, leads were connected from the contact pads to a capacitance measuring or comparing device 56 such as a capacitance bridge. This device compares the capacitance of the thin film device being fabricated to that of a known standard capacitor 58 and, when the desired capacitance value is precisely reached, device 56 will produce a signal which is transmitted to the tape control 50 to cause the operation to be halted. As will be obvious to those skilled in the art, monitoring the capacitance can be most readily accomplished during the intervals between pulses of the electron beam. Top and cross sectional views of the resulting substrate with two thin film capacitors formed thereon are respectively shown in FIGURES 5 and 6. From FIGURE 6 a second obvious advantage of the method of this invention will be apparent. That is, from FIGURE 6 it is obvious that the dielectric surface path length between the capacitor plates is substantially longer than that obtained by previous methods of thin film capacitor fabrication. The increased dielectric surface path length, of course, makes the devices less susceptible to shorting and leakage and thus increases component life.

While one embodiment has been shown and described, various modifications may be made without deviation from the spirit and scope of this invention. For example, by depositing a layer of insulating material and then another conductive layer over the multilayer structure shown in FIGURES 1 through 6, and then practicing the novel method of this invention, four rather than two capacitors may be formed on one surface of one substrate. Also, while the method of this invention has been described as preferably being performed with an intense beam of electrons, it is conceivable that the energized beam generated by a laser could also be used to achieve the same results. Thus, the foregoing description and explanation of this invention are not to be considered as limiting this invention which is defined solely by the appended claims taken in view of the prior art.

We claim:

1. A method of fabricating thin film capacitors comprising the steps of:

depositing a conductive material on a non-conductive substrate as a first area film;

providing a layer of dielectric material over the first area film of conductive material;

forming a second area film of conductive material over the layer of dielectric material;

exposing the surface of the substrate along at least a first line by selectively removing the conductive films and dielectric layer thereby isolating individual devices;

measuring the capacitance of the resulting multi-layer devices; and adjusting the capacitance of each device toward the desired value by incrementally removing the second conductive film from the dielectric layer along the edges of the groove formed during the step of exposing the surface of the substrate along a line, the removal of the second conductive film reducing the area of the upper electrodes of the devices.

2. The method of claim 1 further comprising:

stabilizing the multilayer structure prior to isolating individual devices.

3. The method of claim 2 wherein the step of stabilizing comprises:

annealing the multilayer structure at elevated temperature.

4. The method of claim 3 wherein the step of removing the second conductive film comprises:

etching the second conductive film with an energized beam.

5. The method of claim 1 wherein the step of isolating individual capacitors comprises:

scribing the multilayer structure to the surface of the substrate with an energized beam.

6. The method of claim 5 wherein the step of adjusting capacitance comprises:

selectively etching the second conductive film with an energized beam.

7. A method of fabricating thin film capacitors comprising the steps of:

forming a plurality of conductive terminal pads on at least a first side of a nonconductive substrate and adjacent at least two edges thereof;

depositing a conductive material on the substrate as a first area film, said first area film of conductive material contacting some of the terminal pads;

providing a layer of dielectric material over at least part of the first area film of conductive material;

forming a second area film of conductive material over at least part of the layer of dielectric material, the second conductive film also extending onto the surface of the substrate and being in contact with terminal pads which are not in contact with the first area conductive film;

isolating individual capacitors by exposing the surface of the substrate along predetermined lines by removing the conductive films and dielectric layer therefrom;

individually adjusting the capacitance of each capacitor to the desired value by selectively removing from the dielectric layer increments of the second conductive film, said increments lying along the edge of a groove formed during the isolation of individual capacitors, the capacitance adjustment thus being effected by reducing the area of the upper electrode of each capacitor in step-wise fashion; and measuring the capacitance of the individual capacitor whose value is being adjusted in the intervals between removal of increments of the second conductive film.

8. The method of claim 7 wherein the step of adjusting the capacitance comprises:

removing the second conductive film along the edges of the grooves formed when the materials were removed to isolate individual devices by etching with an intense beam of electrons.

(References on following page)

References Cited

UNITED STATES PATENTS

| | | | |
|---|---|---|---|
| 2,119,115 | 5/1938 | Rohnfeld | 317—242 |
| 2,142,705 | 1/1939 | Tarr | 317—242 |
| 2,525,668 | 10/1950 | Gray | 117—212 |
| 2,842,653 | 7/1958 | Clemons | 29—25.42 |
| 2,958,117 | 11/1960 | Robinson et al. | 29—25.42 |
| 3,080,481 | 3/1963 | Robinson | 250—83.3 |
| 3,110,620 | 11/1963 | Bertelsen | 117—217 |
| 3,162,767 | 12/1964 | Di Curcio et al. | 117—212 X |
| 3,171,757 | 3/1965 | Duddy | 117—217 |
| 3,234,044 | 2/1966 | Andes et al. | 117—212 |
| 3,258,898 | 7/1966 | Garibotti | 117—217 X |

FOREIGN PATENTS 900,725 1/1954 Germany.

OTHER REFERENCES

Selvin et al.: "Proceedings of the 2nd Symposium on Electron Beam Processes," March 24–25, 1960, Boston, Mass., pp. 80–93; p. 89 relied on.

ALFRED L. LEAVITT, *Primary Examiner.*

JOHN F. BURNS, WILLIAM L. JARVIS, *Examiners.*

E. GOLDBERG, *Assistant Examiner.*